US012163996B2

(12) United States Patent
Bixenman et al.

(10) Patent No.: US 12,163,996 B2
(45) Date of Patent: Dec. 10, 2024

(54) ELECTRONIC CIRCUIT BOARD TESTING SYSTEM

(71) Applicant: Magnalytix, LLC, Nashville, TN (US)

(72) Inventors: Michael L. Bixenman, Old Hickory, TN (US); Thomas M. Forsythe, Brentwood, TN (US); Mark McMeen, Huntsville, AL (US); Colin Langley, Harvest, AL (US); James Perigen, Lebanon, TN (US); Bobby Glidwell, Bell Buckle, TN (US)

(73) Assignee: Magnalytix, LLC, Nashville, TN (US)

( * ) Notice: Subject to any disclaimer, the term of this patent is extended or adjusted under 35 U.S.C. 154(b) by 135 days.

(21) Appl. No.: 18/158,040

(22) Filed: Jan. 23, 2023

(65) Prior Publication Data
US 2023/0236240 A1 Jul. 27, 2023

Related U.S. Application Data

(60) Provisional application No. 63/302,097, filed on Jan. 23, 2022.

(51) Int. Cl.
*G01R 31/28* (2006.01)
(52) U.S. Cl.
CPC .............. *G01R 31/2808* (2013.01)
(58) Field of Classification Search
CPC ...... G01R 15/12; G01R 15/144; G01R 19/00; G01R 19/30; G01R 21/06; G01R 31/261; G01R 31/2623
See application file for complete search history.

(56) References Cited

U.S. PATENT DOCUMENTS

| 4,507,605 | A | | 3/1985 | Geisel | |
|---|---|---|---|---|---|
| 4,771,230 | A | * | 9/1988 | Zeh | G01R 1/072 324/459 |
| 4,797,610 | A | | 1/1989 | Fombellida | |
| 5,451,884 | A | * | 9/1995 | Sauerland | G01R 31/2824 324/727 |
| 10,379,153 | B1 | * | 8/2019 | Neves | G01R 31/2818 |

FOREIGN PATENT DOCUMENTS

| JP | 2007327799 A | 12/2007 |
|---|---|---|
| KR | 1020090029957 A | 3/2009 |

OTHER PUBLICATIONS

PCT International Search Report, PCT/US2023/061078, dated May 25, 2023.
PCT Written Opinion of International Searching Authority, PCT/US2023/061078, dated May 25, 2023.

* cited by examiner

*Primary Examiner* — Tung X Nguyen
(74) *Attorney, Agent, or Firm* — Bradley Arant Boult Cummings LLP; Blake M. Bernard

(57) ABSTRACT

A system for testing an electronic circuit board test coupon, including a test chamber. The test chamber can have at least one port through which a port extension member holding a test coupon can be inserted, minimizing air flow between the interior space of the test chamber and the surrounding area to adequately maintain elevated heat and humidity conditions within the test chamber.

20 Claims, 9 Drawing Sheets

ELECTRONIC CIRCUIT BOARD TESTING SYSTEM

CROSS-REFERENCE TO RELATED APPLICATION

The present application claims the benefit of U.S. Provisional Patent Application Ser. No. 63/302,097, filed on Jan. 23, 2022, entitled, "Electronic Circuit Board Testing System," which is incorporated herein by reference.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present disclosure relates generally to testing systems for electronic circuit boards including but not limited to printed circuit boards (PCBs).

More particularly, the present disclosure relates to elevated humidity, temperature, and/or pressure testing for electronic circuit boards. Hot, humid environments significantly impact the robust performance and longevity of printed circuit boards and the components assembled onto those boards in a negative way. This is true when flux residues, no clean, or other soldering technology remain on the boards. Flux residues routinely dissolve or dissociate in water, causing a negative interaction across the metallized conductors regardless of the soldering technology used to manufacture a PCB.

Industry standard J-STD-001 H, established by IPC, outlines the materials, methods, and verification criteria for making high-quality soldered connections in electrical and electronic assemblies. This standard calls for testing soldered electrical and electronic assemblies under elevated heat and humidity conditions, also known as stress testing. When the first version of this standard (J-STD-001A) was first developed in the 1990s, electronics largely existed in climate controlled environments and these stress tests were considered "very harsh" and commonly viewed as an accelerated life test. Since then, the use of electronics in automotive, mobile phone, and other applications has proliferated, and today, electronic devices are routinely exposed to hot, humid conditions in many parts of the world for large portions of their expected useful lives. Accordingly, the importance of stress testing has exponentially increased to ensure that electronics can properly function in all the environments in which they may be used.

Electronics have also become increasingly miniaturized over time, and smaller electronics require increasingly smaller PCB layouts, smaller components, lower standoffs, and multiple PCB layers. All of these features have made it far more challenging, in today's ultra-low standoff and ultra-dense designs, to execute the multiple soldering steps used to build electronic assemblies and to enable proper flux outgassing, which is the mechanism by which certain materials in the flux formulation "exit" or leave the assembly prior to it being used for is designed purpose. The performance of electronic assemblies in elevated humidity environments is directly proportional to both the successful flux outgassing during production, particularly for assemblies utilizing no-clean fluxes, and, for assemblies that undergo a cleaning process, the successful removal of all residues in all areas of the circuitry for PCB after soldering or desoldering.

Contamination due to unsuccessful flux outgassing, unexpected production operational debris, or inadequate cleaning can be ionic or non-ionic in nature. Ionic residues are more problematic when exposed to elevated humidity environments because the charged ions in the residue can be mobilized by moisture and higher temperatures, and these stray ions can alter the current flowing through a PCB. This may lead to electrochemical migration and cause dendritic growth, short circuiting, corrosion, and other serious issues in the PCB. The soldering and assembly process causes contamination build-up from flux and other process residues. Controlling the contamination levels in electronics can significantly enhance the operational robustness of PCBs in humid environments, which improves the reliability of electronic devices during their intended use throughout the world.

As previously stated, elevated heat and humidity testing conditions are ideal for detecting potential failures in electronic assemblies by measuring and tracking the electrical performance of such assemblies over time. One long-standing process validation method called surface insulation resistance (SIR) testing not only detects the presence of flux and other process residues, but also quantifies the effects of these residues on electrical assemblies, such as electrical leakage and dendritic growth propagation. SIR test protocols are commonly carried out at 40° C. at 90% relative humidity using a pre-set electrical bias over very long periods of time, from 7 to as many as 42 days. Given the considerable length of these test periods, when failures and/or defects are detected, a large amount of unsatisfactory product may be produced while a test is ongoing.

In conventional SIR testing, the full PCB to be tested is placed in an elevated temperature, humidity, and/or pressure chamber and connected to one or more fixed electrical connection ports positioned within the chamber. Because the user must reach into the chamber to connect the PCB to the electrical connection port, large doors are provided on the chamber to access the electrical connection port. Each time the doors are opened, the temperature and humidity inside the test chamber is significantly affected. Thus, tests are generally run for substantial periods of time, including a defined chamber stabilization period of as long as 24 hours because the chamber must attain the proper testing temperature, humidity, and pressure after the chamber door is closed following setup. And once a test in the chamber has begun, another test cannot be implemented as opening the chamber door would greatly alter the conditions of the test then in progress, leading to inaccurate or skewed test results.

What is needed then are improvements in electronic circuit board testing systems.

BRIEF SUMMARY

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One aspect of the present disclosure is a system for testing an electronic circuit board test coupon, the system includes a test chamber having one or more side walls defining an interior space and is operable to maintain the humidity, temperature, or pressure of the interior space within a desired humidity, temperature or pressure range when the test chamber is closed off from ambient air. At least one port can be defined in the one or more side walls of the test chamber, the port selectively providing access to the interior space of the test chamber. A power source/meter can be electrically connected to a port extension member, the port extension member removably insertable through the at least one port, the port extension member including a distal end. At least one test coupon connection port can be located on the distal end of the port extension member and connected to the power/meter source, the at least one test coupon connection port configured for receiving and electrically connecting to the electronic circuit board test coupon. When the electronic circuit board test coupon is received in the test coupon connection port and the port extension member is inserted through the port, the power source can supply power to the test coupon and monitor various electrical parameters of the test coupon to perform the required test.

Numerous other objects, advantages and features of the present disclosure will be readily apparent to those of skill in the art upon a review of the following drawings and description of a preferred embodiment.

BRIEF DESCRIPTION OF THE DRAWINGS

FIG. 1 is a perspective view of the exterior of the testing system and test chamber of the present disclosure.

FIG. 2 depicts one embodiment of the electrical twin concept of the present disclosure.

FIGS. 3-6 are side views of the exterior of the test chamber of FIG. 1.

FIG. 7 is a detail view of embodiments of a port and a port extension of the present disclosure.

FIG. 8 is a cross-section of embodiments of a port and a port extension of the present disclosure.

FIG. 9 is a perspective view of embodiments of a port and a port extension of the present disclosure.

FIG. 10 is a cross-section of embodiments of a port and a port extension of the present disclosure.

FIGS. 11 and 12 are perspective views of one embodiment of the interior space of the test chamber of the present disclosure.

DETAILED DESCRIPTION

Figure 1:
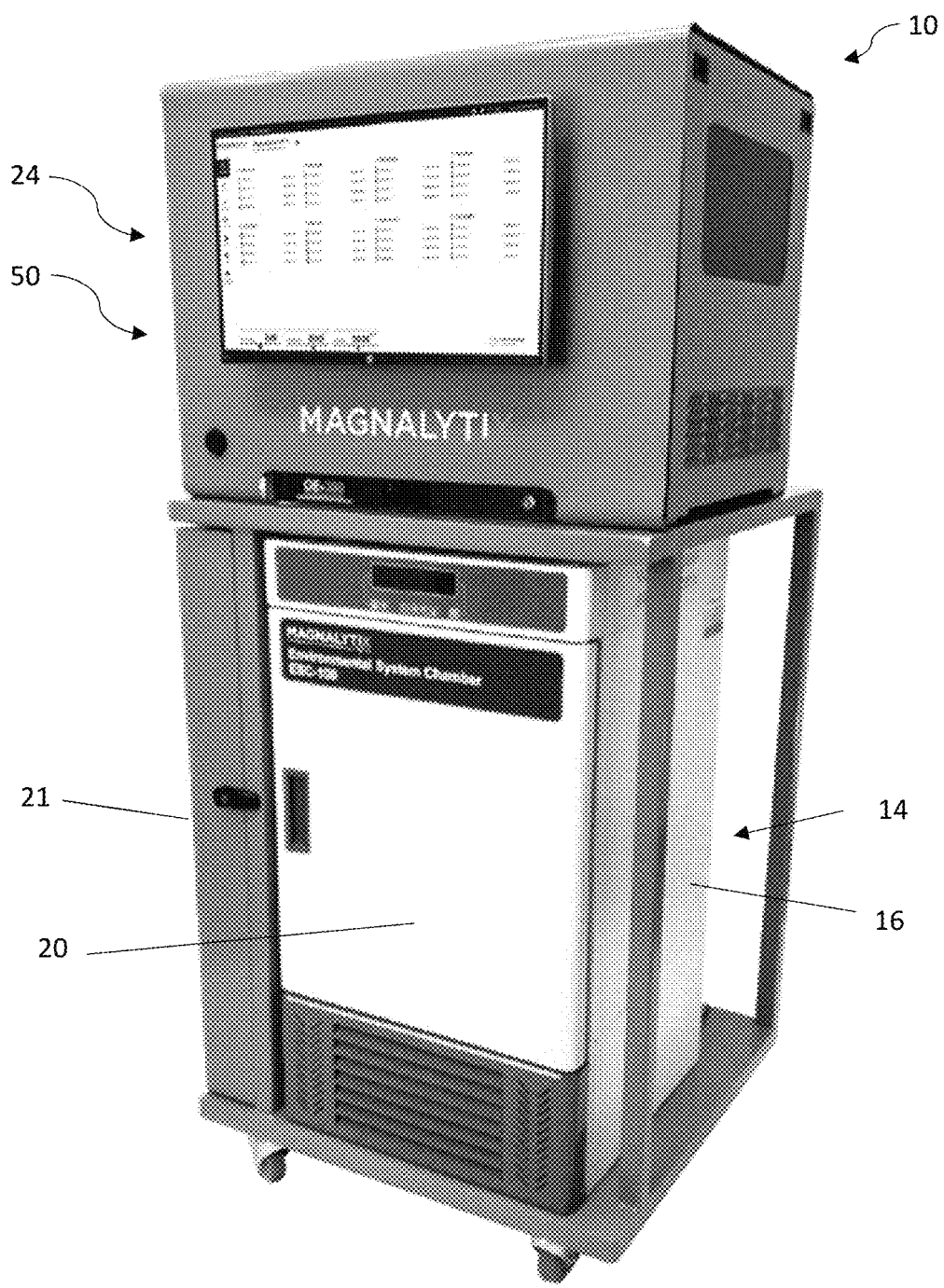
FIGS. 1-12 show various views and embodiments of the testing system and test chamber of the present disclosure.

While the making and using of various embodiments of the present invention are discussed in detail below, it should be appreciated that the present invention provides many applicable inventive concepts that are embodied in a wide variety of specific contexts. The specific embodiments discussed herein are merely illustrative of specific ways to make and use the invention and do not delimit the scope of the invention. Those of ordinary skill in the art will recognize numerous equivalents to the specific apparatus and methods described herein. Such equivalents are considered to be within the scope of this invention and are covered by the claims.

In the drawings, not all reference numbers are included in each drawing, for the sake of clarity. In addition, positional terms such as "upper," "lower," "side," "top," "bottom," etc. refer to the apparatus when in the orientation shown in the drawing. A person of skill in the art will recognize that the apparatus can assume different orientations when in use.

As shown in FIGS. 1-12, one aspect of the present disclosure is a system 10 for testing an electronic circuit board test coupon 12. The system 10 includes a test chamber 14 having one or more side walls 16 defining an interior space 18. The test chamber 14 is operable to maintain the humidity, temperature, and/or pressure of the interior space 18 within desired ranges for prolonged periods of time when the test chamber 14 is substantially closed off from surrounding or ambient air. The test chamber 14 being "closed off" from surrounding or ambient air means that all doors 20, ports 22 (as discussed further herein), or other such entrances to the interior space 18 are substantially closed or covered and surrounding or ambient air is prevented from entering the interior space 18. The system 10 and test chamber 14 can be operable to maintain relatively constant temperatures and/or humidity within the chamber 14, or to maintain an overall pressure of the test chamber 14 (based on the temperature and humidity, as dictated by the ideal gas law (PV=nRT)).

At least one port 22 can be defined in the one or more side walls 16 of the test chamber 14, the port 22 selectively providing access to the interior space 18 of the test chamber 14. The system 10 can further include a port extension member 26 having a proximal end 28 and a distal end 30, the port extension member 26 removably insertable through the at least one port 22. At least one test coupon connection port 32 can be located on the distal end 30 of the port extension member 26, each test coupon connection port 32 configured to receive and electrically connect to the electronic circuit board test coupon 12. The system can further include a power source 24 electrically connected to the port extension member 26. The power source 24 can supply power to the port extension member 26 and the test coupon connection port 32 located thereon, thus the power source 24 can supply power to the test coupon 12.

Figure 13:
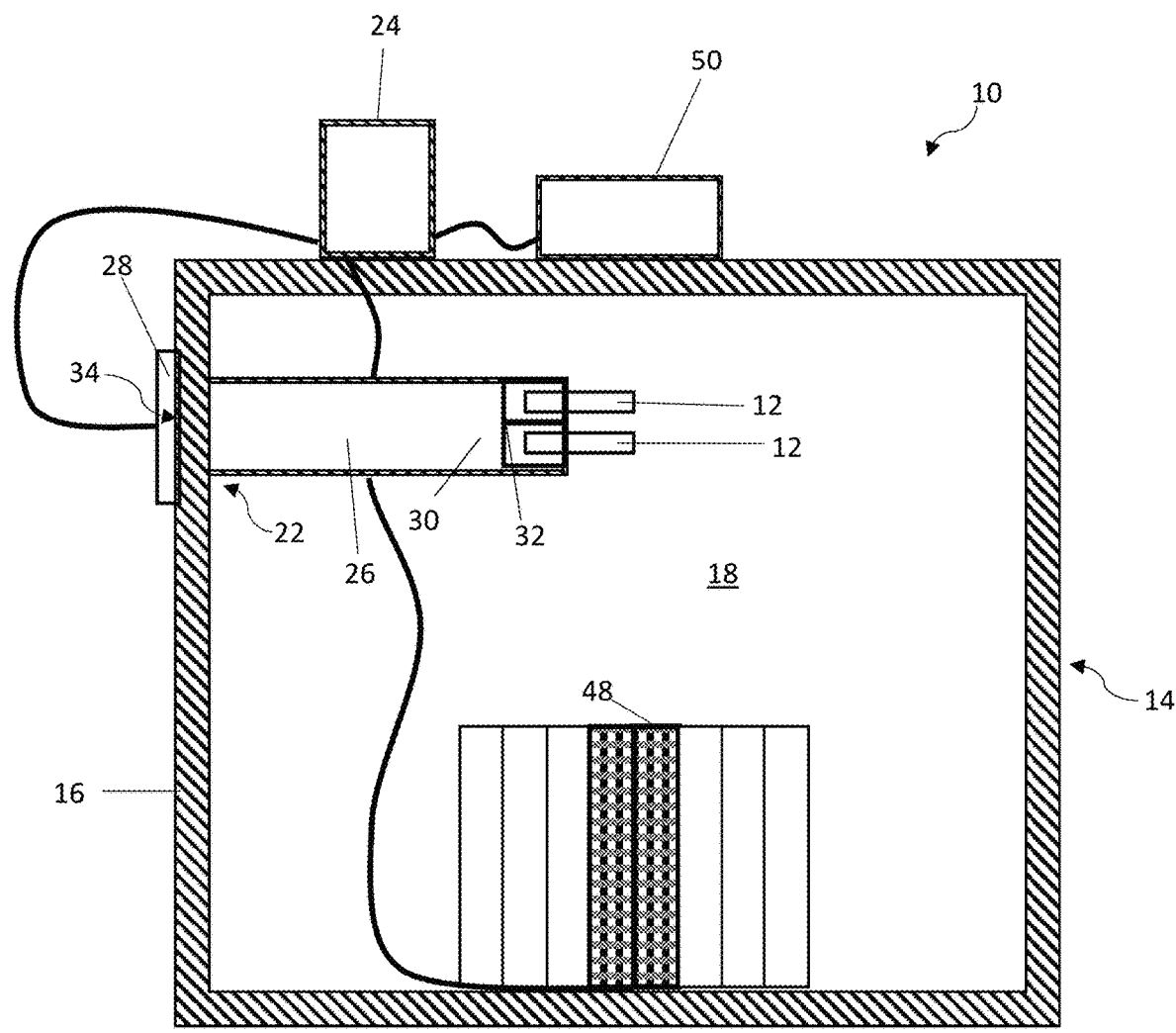
FIG. 13 is a schematic drawing of a cross section of one embodiment of the test chamber of the present disclosure.

The system 10 can also include a high precision electrical meter 50 electrically connected to the power source 24 (as shown in FIG. 13) and capable of measuring very small amounts of electrical current, resistance or voltage, and/or capacitance. During a test, as further described herein, when the test coupon 12 is inserted into the test coupon connection port 32 on the distal end 30 of the port extension member 26, and the port extension member 26 is connected to the power source 24 and inserted into the test chamber 14, the electrical meter 50 can be operable to measure current, resistance voltage, and/or capacitance of the test coupon 12. For example, in some embodiments, the power source 24 can provide bias power to the test coupon 12 during a test. When a measurement of electrical current, resistance, voltage, and/or capacitance is to be made by the electrical meter 50, the power source 24 can cease providing bias power while the electrical meter 50 provides measurement power to the test coupon 12, thus enabling such measurement.

In some embodiments, as shown in FIGS. 4-10, the at least one port 22 can include an exterior opening 34 and a coupling member 36 positioned adjacent the exterior opening 34. The proximal end 28 of the port extension member 26 can be configured to engage the coupling member 36 on the at least one port 22. When the distal end 32 of port extension member 26 is inserted through the at least one port 22 and into the interior space of the test chamber 14, engaging the proximal end 28 of the port extension member 26 with the coupling member 36 on the port 22 can secure the port extension member 26 within the at least one port 22. During a test, as further described herein, when a test coupon 12 is inserted into the test coupon connection port 32 on the distal end 30 of the port extension member 26, this secure engagement between the port extension member 26 and the port 22 can allow for the test coupon 12 to maintain a stable position within the test chamber 14 and for the test chamber 14 to remain closed off from surrounding air.

To accomplish this secure engagement, in some embodiments (as shown in greater detail in FIGS. 7-10), the proximal end 28 of the port extension member 26 can include a flange 38 that can extend radially outward from the port 22. When the port extension member 26 is inserted into the port 22, the flange 38 can engage with the coupling member 36 on the external opening 34 of the port 22. In some embodiments, the coupling member 36 can further include a screw or protrusion 40 that can be received in a slot 42 in the flange 38 of the port extension member 26, such that the flange 38 can be rotated to achieve a gasketed twist-lock engagement between the flange 38 and the coupling member 36. This can allow the port extension member 26 to be selectively retained in the port 22. One of skill in the art will recognize that any suitable coupling mechanism or coupling member 36 can be utilized between the proximal end 28 of the port extension member 26 and the exterior opening of port 22, including but not limited to interference fits, hook and loop fasteners, clamps, latches, and other types of twist locks, gaskets, and O-rings. In other embodiments, the port extension member 26 can be secured in the port 22 via coupling elements that are positioned inside the port 22 or even within the test chamber 14, as opposed to adjacent an exterior opening 34 of the port 22.

Figure 4:
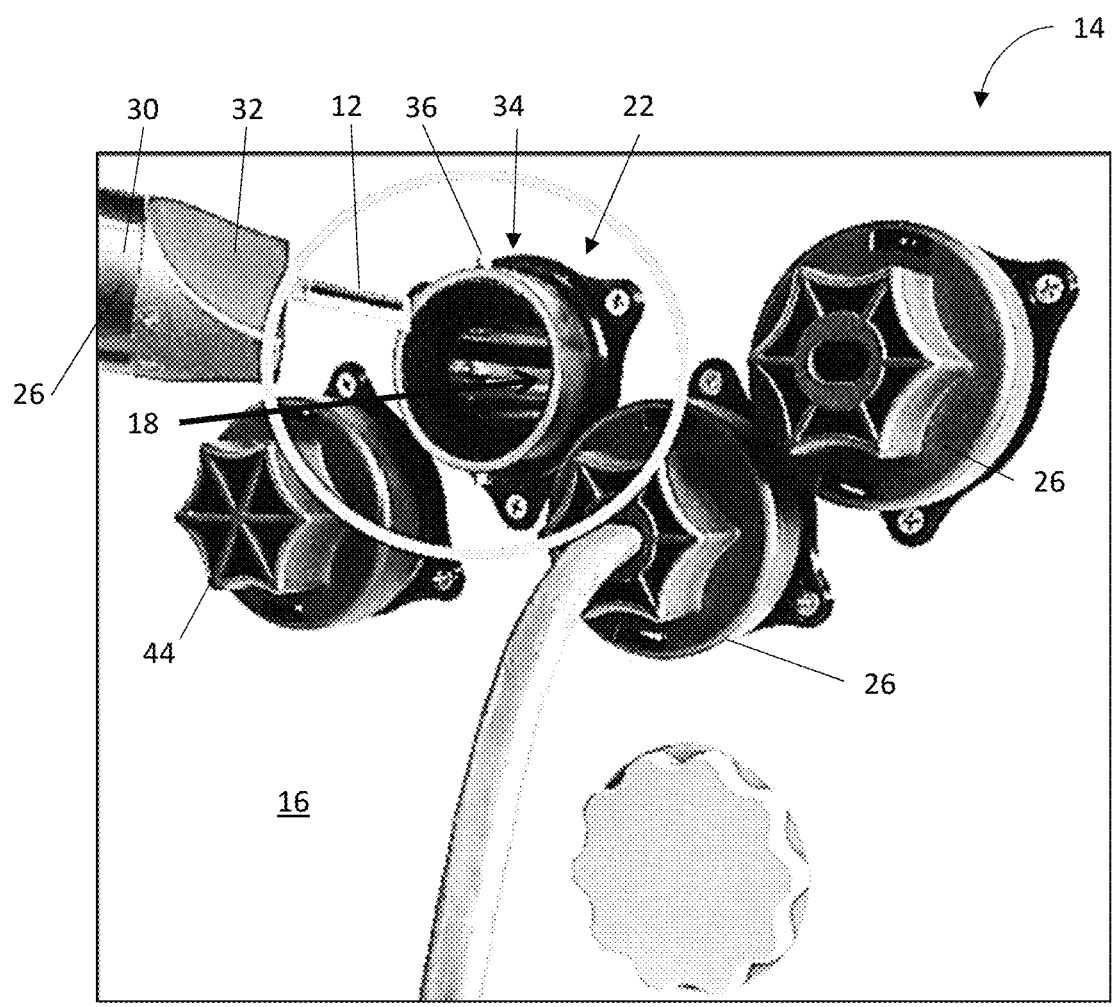
Figure 6:
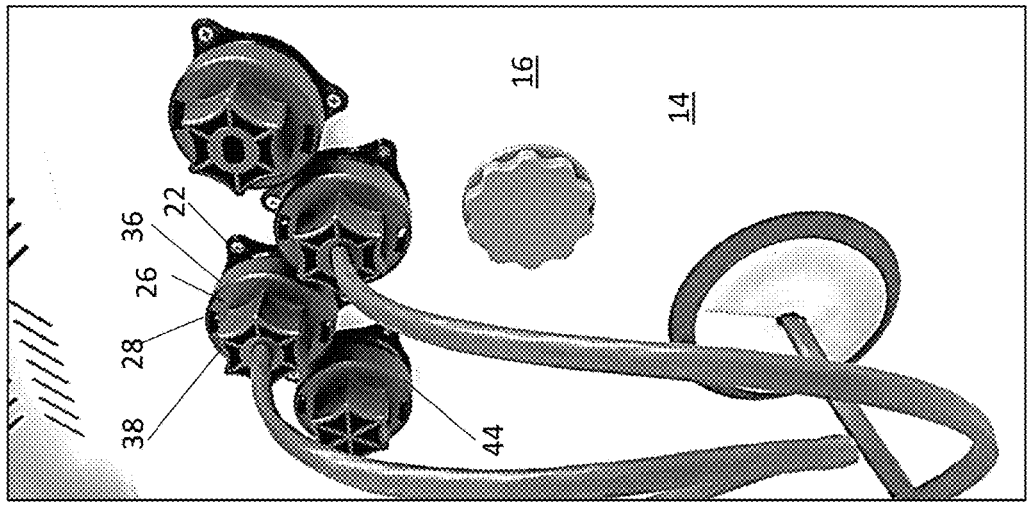
Figure 5:
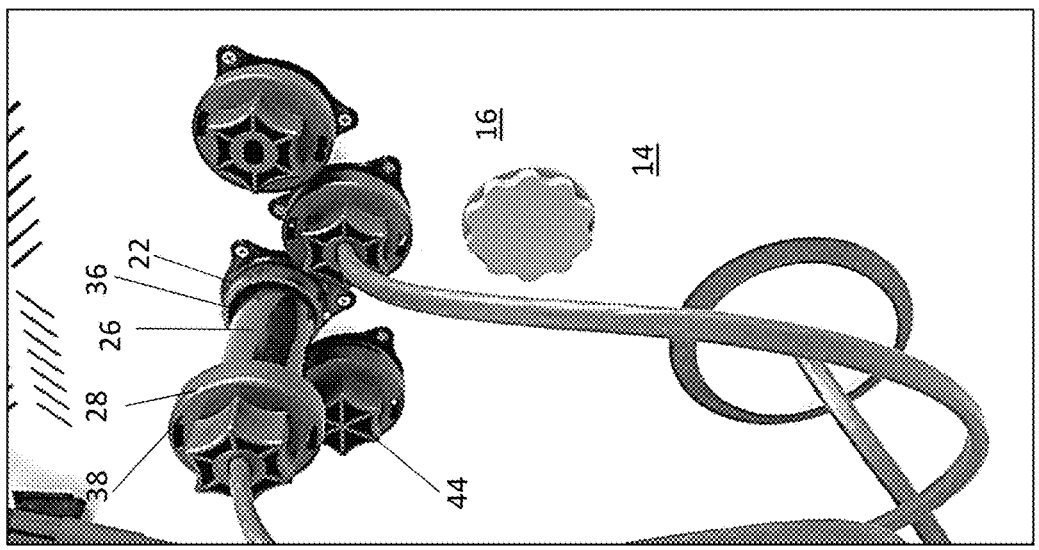
Figure 7:
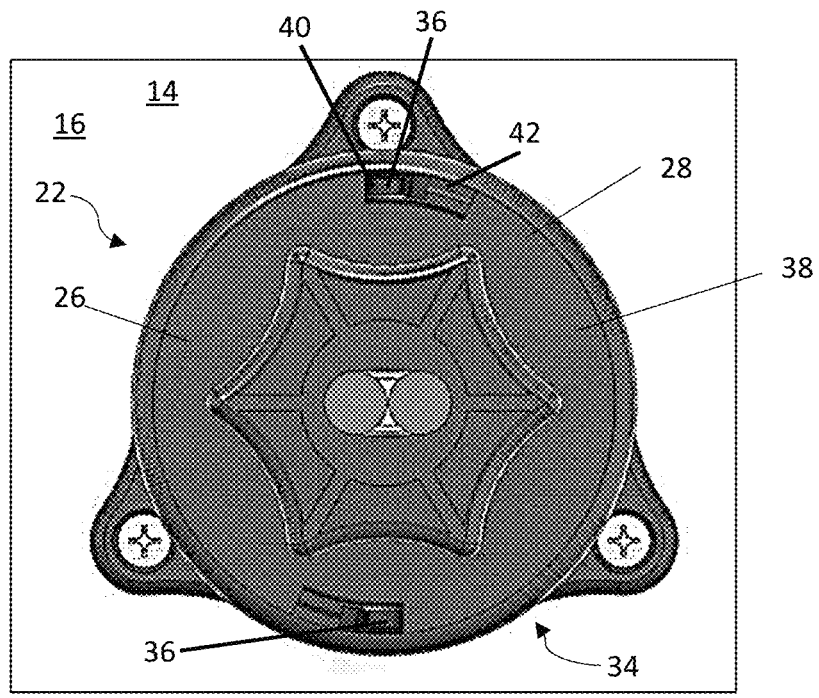
Figure 8:
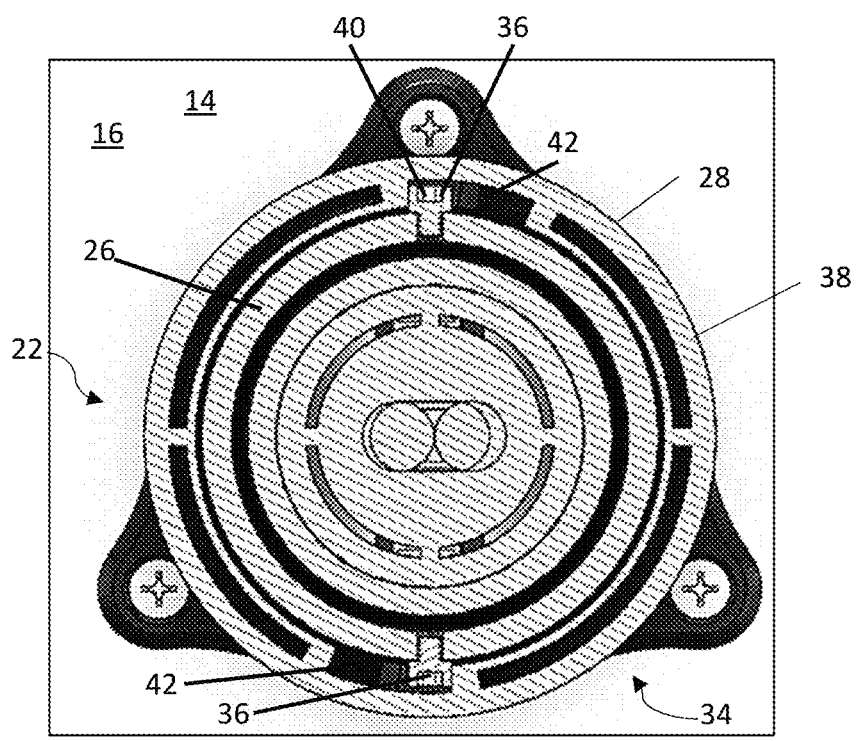
Figure 9:
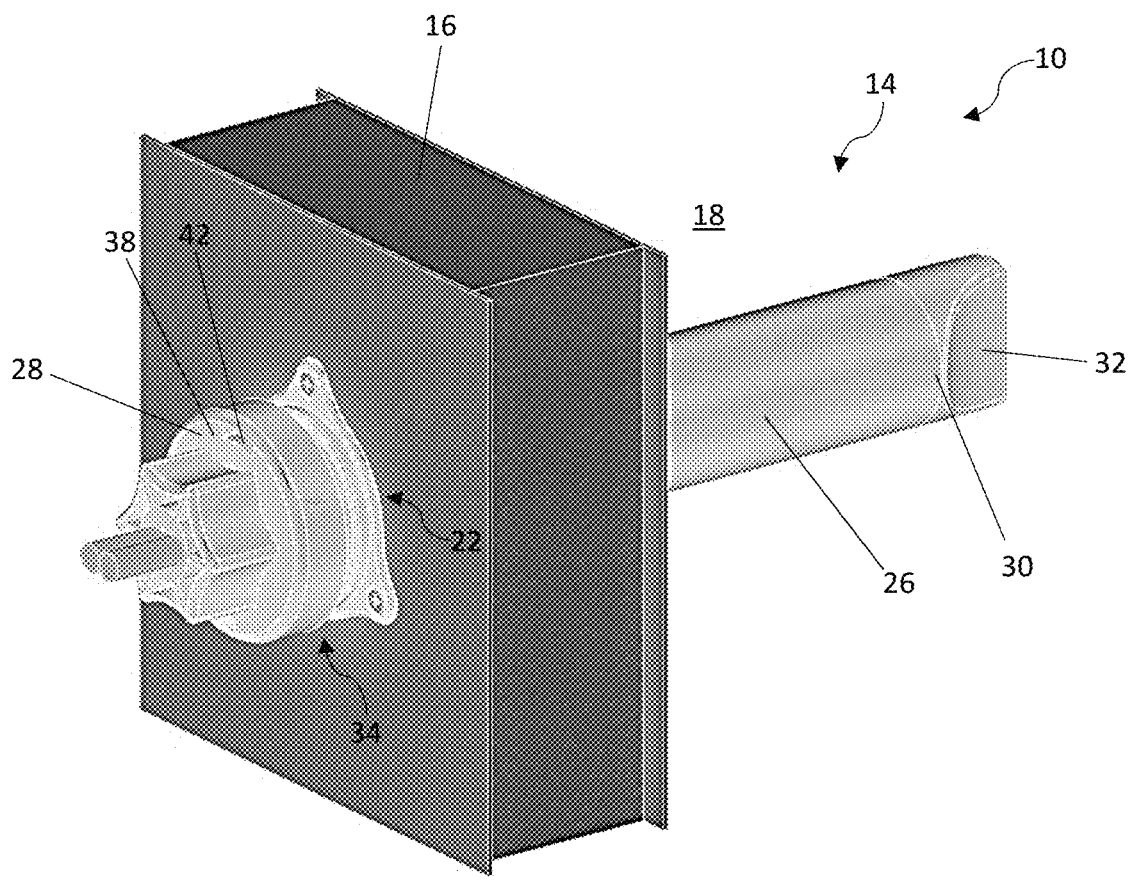
Figure 10:
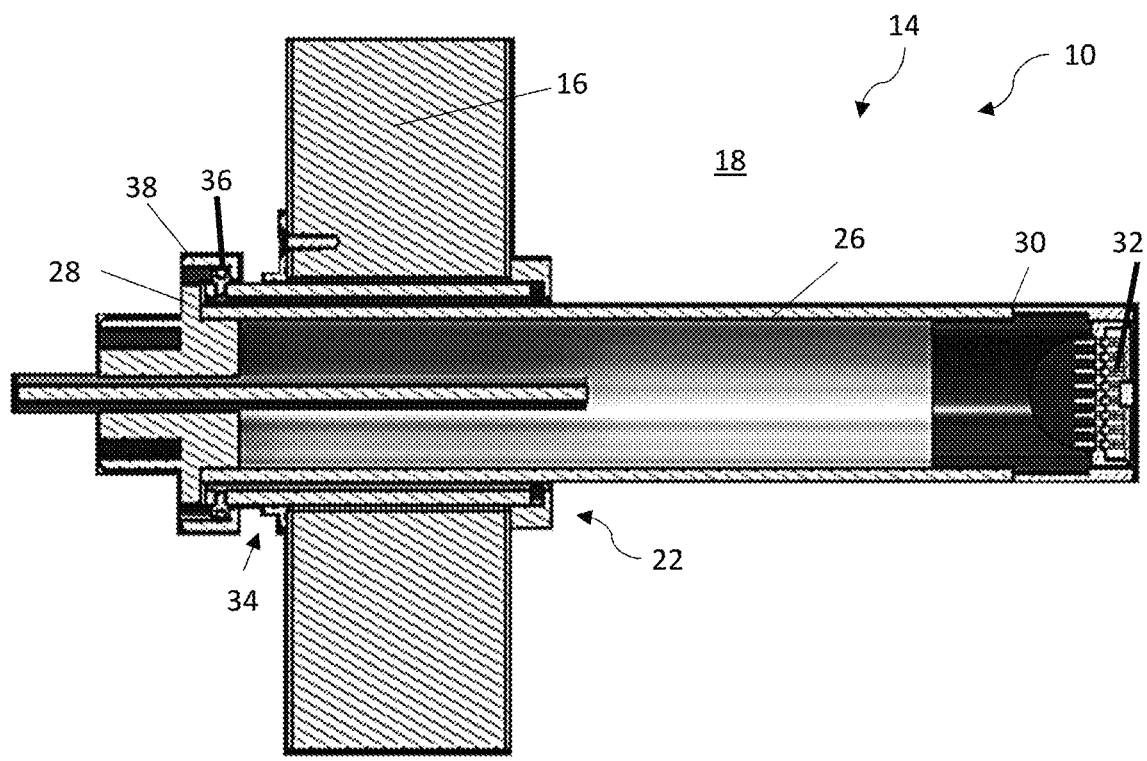

In some embodiments, as shown in FIGS. 4-6, the test chamber 14 can include a plurality of ports 22 defined in one or more of the side walls 16 of the test chamber 14. In some embodiments, all the ports 22 can be defined in the same side wall 16, while in other embodiments ports can be defined in different side walls 16. Having all ports 22 defined in the same side wall 16 can allow multiple port extension members 26 to extend through corresponding ports 22 in a parallel fashion. As such adjacent port extension members 26 and test coupons 12 are unlikely to collide within the test chamber 14, thus reducing the risks of damage to test coupons 12 and interference with in-progress tests. Additionally, when all ports 22 are defined in the same side wall 16, that side wall 16 can be contained under a removable cover 21, as shown in FIG. 1 (wherein the ports 22 are located inside of/under the cover 21, and thus not shown). This can help protect the port extension members 16 from inadvertent tampering or contact during a test, which can affect the accuracy and precision of a test being performed and cast doubt on the validity of the test results.

In some embodiments, the system 10 can further comprise one or more port caps 44 operable to engage the coupling member 36 of a corresponding port 22. The port caps 44 can also cover the port 22 when no port extension member 26 is positioned within the port 22 and the port 22 is not in use for a test. Thus, when the system includes multiple ports 22 and port caps 44, a user can prepare a port extension member 26 and test coupon 12 to be inserted into a first port 22, while another test is currently in progress in second port 22, and the first port 22 can remained covered during such preparation. This further enhances the ability to maintain the environmental conditions within the test chamber 14. Having multiple ports 22 and covering all ports 22 not in use with port caps 44 also allows a user to initiate tests at different points in time and/or run simultaneous tests, while maintaining substantially constant environmental conditions within the test chamber 14.

The test chamber 14 can have a main access door 20, and the ports 22 can be of a significantly smaller size than the main access door 20. As such, when the port extension members 26 and test coupons 12 are inserted or removed from the test chamber 14, relatively little surrounding or ambient air can enter through the briefly-open port 22 and displace the hotter, more humid air from within the test chamber 14. Accordingly, environmental conditions within the test chamber 14 can be substantially maintained when the port extension members 26 and the test coupons 12 thereon are changed or removed, and thus changing or removing the port extension members 26 and test coupons 12 can have a minimal effect on any ongoing tests. This provides increased versatility in how the test chamber 14 can be used as compared to prior art test chambers, wherein opening the single, large main access door 20 severely impacts the accuracy and validity of the ongoing test within the test chamber 14. In prior art test chambers once a test has been initiated, no further tests can be initiated in the test chamber until the ongoing test, which often lasts days, has concluded.

One of skill in the art will recognize that the ports 22 (and thus the corresponding port extension members 26 and/or port caps 44) may vary in size and shape. The figures show circular ports 22 but are not intended to limit the ports 22 to have a circular or annular shape. In some embodiments, the ports 22 can be less than 8, 4, 3, 2, 1.5, or 1 inches in both height and width. In some embodiments, the height and width of the ports 22 can each be between 1 and 8, 1 and 4, 1 and 3, or 1 and 2 inches. In some embodiments, all or some of the ports 22 can have the same height and width, while in other embodiments, each port 22 can have a different height and/or width from the other ports 22. Having ports 22 and corresponding port extension members 26 of varying sizes can allow for the most efficient insertion testing of test coupons 12 of varying sizes: smaller test coupons 12 and port extension members 26 can be inserted through smaller ports 22, thereby minimizing the leakage of surrounding or ambient air into the test chamber 14 during removal or insertion of the port extension member 26 and maximizing the stability of the environmental conditions within the test chamber 14.

Figure 2:
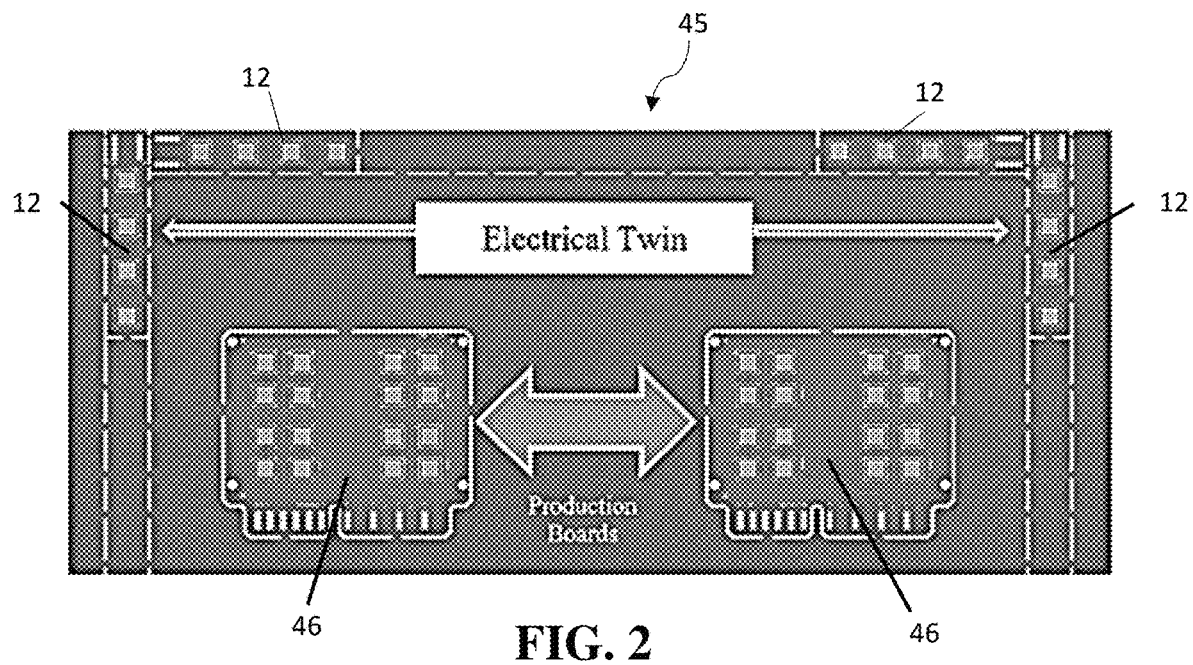
Figure 3:
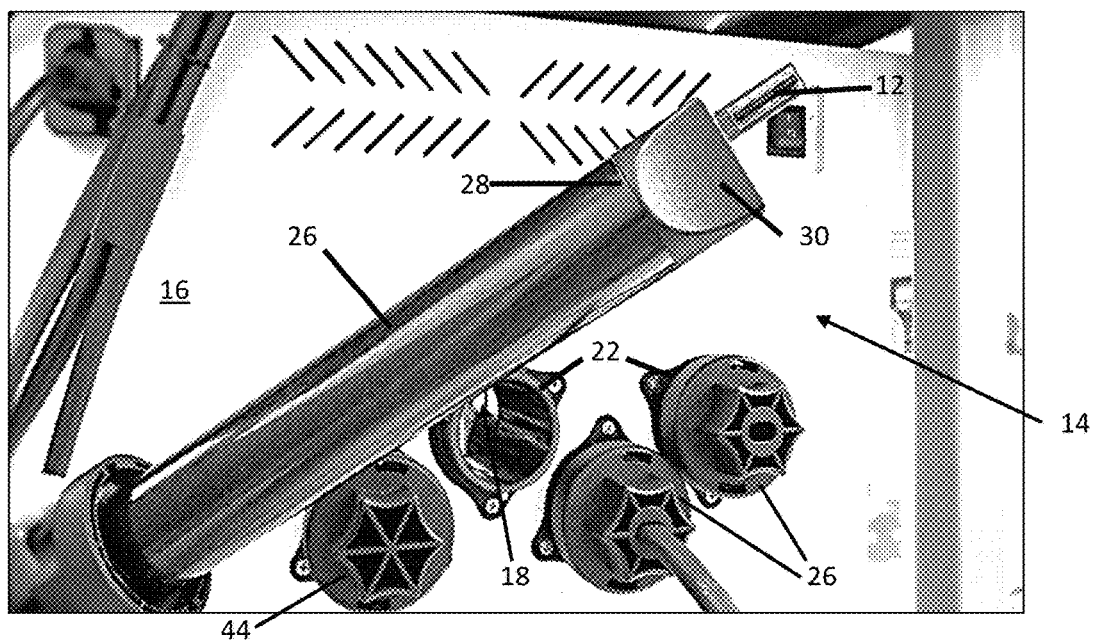

Another aspect of the present disclosure is the concept, coined by the Applicant, of an "electrical twin." The electrical twin concept centers on designing an electrical single- or dual-channel test coupon 12 into a production panel 45 that contains multiple production circuit boards 46. FIG. 2 depicts one embodiment of the electrical twin concept utilizing single-channel test coupons 12 in the production panel 45. The production panel can be designed such that these electrical twin test coupons 12 are located in unused "waste" areas on the edges of a production panel 45, which adds little to no incremental cost to production. After production, the smaller electrical twin test coupon 12 can be removed from the production panel 45 containing the production circuit boards 46, placed within the test coupon connection port 32 of the port extension member 26, and inserted into the test chamber 14 through one of the ports 22.

These electrical twin test coupons 12 can contain the key portions of the production circuit board 46 that are most susceptible to contamination risks. And, because electrical twin test coupons 12 are produced with and on the same panel 45 as the production circuit board 46, they are truly representative of production hardware and the processes that the production circuit boards 46 experiences during manufacture. Thus, instead of subjecting full-size test or production circuit boards 46 to intense elevated heat and humidity test conditions, which risks damage to and/or waste of an otherwise sellable production assembly, the smaller electrical twin test coupon 12 can be isolated from the panel 45 containing the production circuit board 46 and tested alone.

Contamination of circuit boards 46 can be significantly higher at point-specific or site-specific areas, meaning areas near or beneath certain components such as QFPs, than other areas or portions of the circuit board such as BGAs. While contamination in point-specific areas is often the cause of circuit board failures, it is not typically detected using a full-board resistivity of solvent extract (ROSE) test for a host of reasons. For one, the ROSE method cannot solubilize the contaminants, thereby preventing their detection. The ROSE method solution also cannot penetrate underneath the small electrical components, particularly bottom termination components, which prevents the ROSE system from measuring contamination in those difficult-to-penetrate areas. Finally, the ROSE method reports an average circuit board resistivity measurement that averages the conductive materials detected over the entire surface area of the circuit board. Such averaging understates the risks associated with high levels of contamination in point-specific areas on the assembly at higher risk of failure.

In one method of the present disclosure, as full production panels 45 are printed, the production equipment can periodically populate an electrical twin test coupon 12 with desired "dummy" components and point-specific areas that are identical to or reflective of those components and point-specific areas in the production circuit board 46 that present the highest risk of contamination and/or process failure. To be clear, the electrical twin test coupon 12 need not be populated in each and every production panel 45, but rather the electrical twin test coupons 12 can be populated on a statistically determined, periodic basis, such as every $100^{th}$ or every $1000^{th}$ panel. This enables statistical sampling and can reduce overall production costs and waste. Further, this method allows for detection of contamination in the point-specific areas in the production circuit board 46 that are most likely to cause failure.

The electrical twin test coupons 12 can be used in short-term (for example, 2 hours) process control tests or in longer (e.g. 168 hours or more) tests for validating, or revaluating on a periodic basis, the qualified manufacturing plan for the corresponding full-size test circuit board. Designing electrical twins into the production panels that hold production circuit boards 46 can lower or even eliminate the risks associated with testing sellable production assemblies, thus electrical twins provide a novel, very low cost test vehicle for routine use to directly test and calibrate manufacturing plans for full circuit board panels 45.

A basic assumption in industrial process control is that all evaluations for defects and deviations from the desired end result are conducted on the same assemblies and components from the same production line. A key feature and benefit of employing electrical twin test coupons 12 is that they are produced contemporaneously with and on the same production panel as the production circuit boards 46, and thus both the production circuit boards 46 and electrical twin test coupon(s) 12 on a given panel are soldered with the same soldering materials and undergo the same process conditions in production. For example, the testing system 10 of the present disclosure can detect ionic process residues present on or beneath the components of electrical twin test coupons 12 (generally by detecting lower insulation resistance) when the electrical twin test coupon 12 is biased and exposed to elevated environmental conditions, which indicates that the same ionic process residues are present on or beneath, at the very least, the same components that are mirrored on the production circuit board 46. Using large scale test assemblies, this electrical test methodology has long been considered the gold standard of electrical testing for process validation pre-production and is reliable and reproducible. The electrical twin concept allows this same gold-standard approach to be used for process control during production.

Applicant has spent the past 6 years running hundreds of electrical twin tests and collecting thousands of data sets from those tests. The availability of this big data has provided a window into electrical testing results that was previously unavailable. Analysis of this data revealed a 90% correlation between the results of electrical twin tests, run for as little as 2 hours, with longer, 7-day (or longer) validation methods, provided that the test environment remained substantially undisturbed for the duration of each test. While these results may not be adequate for true process validation, a 90% success rate certainly indicates that the system 10 disclosed herein is a viable alternative to full-board testing for process control purposes and methods.

Returning to the environmental test chamber 14, the key to precise humidity and temperature control, and consequently the key to conducting valid tests with reliable results, is stability. In some environmental chamber control tests, the environmental control tolerances can be $40°$ C.$\pm 2°$ C. with respect to temperature and 90%$\pm$3% RH with respect to humidity, though it would be readily recognized that these designed-for target temperatures and relative humidities can be adjusted as desired for any given test. Generally speaking, stabilization or stability is achieved when the test coupon 12 acclimates to the environment within the chamber; that is, the temperatures of the chamber interior surfaces and test coupon 12 each change less than 2° C. per hour, while having no external or internal variations in load. For example, opening the door 20 to the test chamber 14 while a test is ongoing can destroy stability because it rapidly and dramatically varies the temperature and humidity levels in the test chamber 14, causing condensation to occur on the test samples. Such an event will invalidate the results of ongoing test, which wastes not only the test samples but also the time already expended in the test and the resources already expended in manufacturing the test assemblies.

Prior art testing systems have typically been capable of running tests on multiple circuit boards simultaneously; the limiting factor in the temporal efficiency of these systems has always been the environmental chamber. Once a test has begun, initiating additional tests of additional circuit boards is no longer practical because the door to the test chamber must be opened to insert the additional test vehicles, which corrupts the test already underway and generally produces a negative outcome. The testing system 10 of the present disclosure overcomes this limitation by allowing test coupons 12 to be inserted and removed during already-ongoing tests of test coupons 12 or full circuit boards 46 without causing a significant environmental change that would invalidate the results of the other tests in the test chamber 14.

Figure 11:
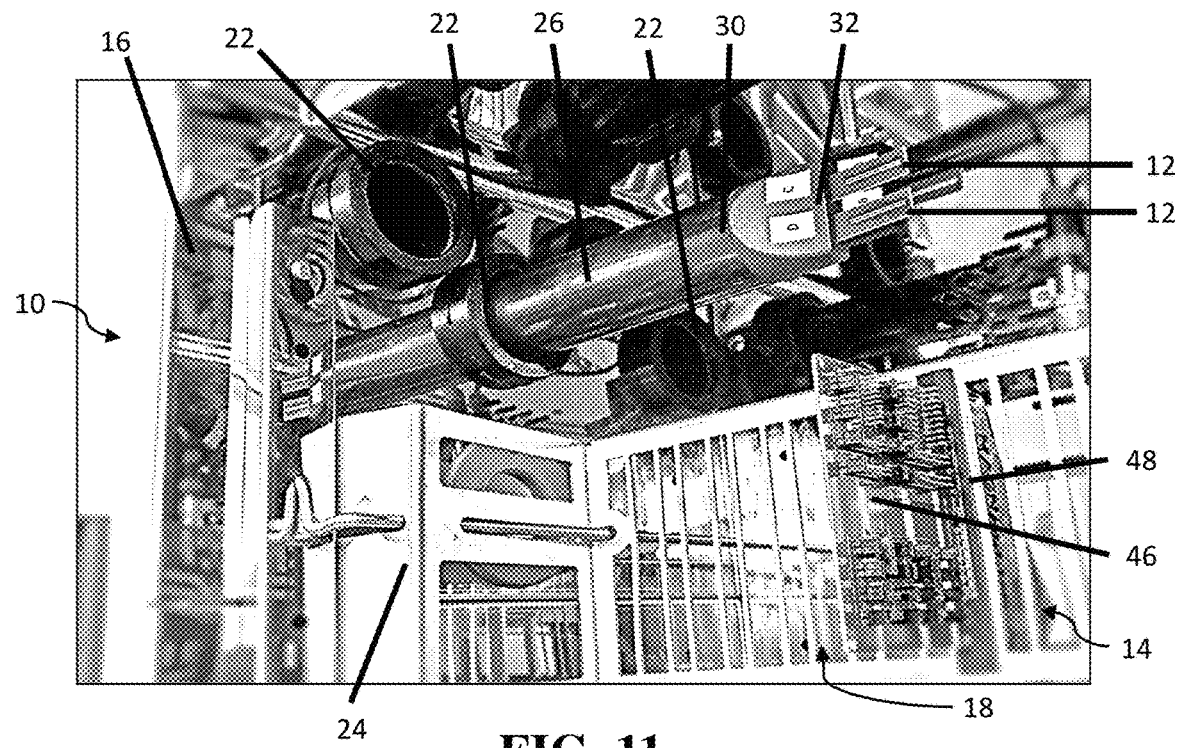
Figure 12:
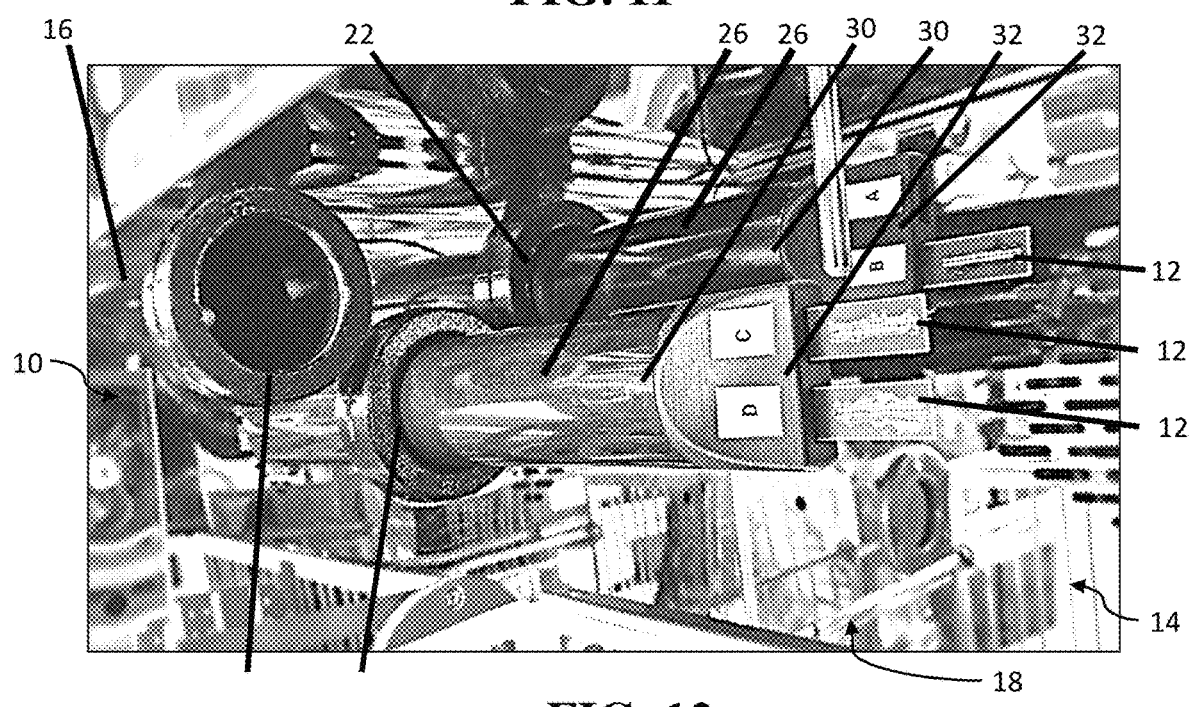

In some embodiments, as seen in FIGS. 11-13, the test chamber 14 can be designed for running both long and short duration tests concurrently without compromising chamber stability. The test chamber 14 can incorporate one or more easy access ports 22 for initiating both long and short tests on the electrical twin test coupons 12 disclosed herein while maintaining stability within the test chamber 14. The port extension arms 26 can be removed from the test chamber 14 to insert one or two electrical twin test coupons 12 into the test coupon connection port 32 on the extension member 26. The extension member 26 can then be reinserted back into the test chamber 14, then the desired test protocol can be set up and initiated for the newly introduced test coupon 12. During the brief period of time during which a user sets up the new test on the newly introduced test coupon 12, the smaller-mass electrical twin test coupon can reach stability with the test environment. The brief opening of the port 22 for the new test also has little impact on the internal environment in the test chamber 14 such that other ongoing tests remain unaffected.

In some embodiments, the system 10 can be used to test smaller test coupons 12 as well as full-size circuit boards 46. The system 10 can further include a fixed electrical connection port 48 mounted within the interior space 18 of the test chamber 14, the fixed electrical connection port 48 electrically connected to the power source 24 and configured to receive the full-size circuit board 46. As such, full validation tests for larger full-size circuit boards 46 can occur simultaneously with production tests on the electrical twin test coupons 12, the electrical twin test coupons 12 being interchanged and production tests being initiated as needed.

The location of the test coupon 12 within the chamber 14 can be of significant importance. In some embodiments, the test chamber 14 can be equipped to produce air flow within the chamber 14. In such embodiments, it would be beneficial to generally locate the test coupon 12 in a central portion of the interior space 18 of the test chamber 14. In some embodiments, the port extension member 26 can be sized such that when inserted through the at least one port 22, the port extension member 26 is long enough to position the test coupon 12 at a distance from the side walls 16 to minimize bleeding or interference of outside or surrounding temperatures and humidity through the port 22 and/or the port extension member 26. In some embodiments, when fully inserted through the port 22, the extension member 26 can extend across at least 25 percent of the width of the test chamber 14 from the port 22. In other embodiments, the extension member 26 can extend across at least 30, 35, 40, 45, or 50 percent of the width of the test chamber 14 from the port 22. In some embodiments, the port extension member can also be made from a material having ample potting characteristics (i.e., moisture and temperature resistance) to further mitigate interference within the test chamber 14 from outside or surrounding air.

In some embodiments having a fixed electrical connection port 48, the ports 22 and/or the port extension members 26, and thus test coupons 12 when inserted, can be spaced away from the fixed electrical connection port 48. For instance, in some embodiments, the ports 22 and thus the port extension member 26 can be positioned on an upper portion of the one or more side walls 16, and the fixed electrical connection port 48 can be positioned on a lower portion of the interior space 18 of the test chamber 14. The system 10 can be configured to run simultaneous tests on both the smaller test coupon(s) 12 inserted in the port extension members 26, "above," and a more standard, larger coupon or full-size test circuit board 46, "below," in the more standard permanent or fixed electrical connection port 48 or rack. The standard test of the larger coupon or full-size test circuit board 46 could run for a longer period of time (i.e., several days or weeks), while multiple tests of the smaller test coupon(s) 12 disclosed herein can each be initiated periodically throughout the duration of the standard test of the larger coupon and run for a few hours. Because of the smaller size of the ports 22 as compared to the larger size of the main access door 20 that must be opened to install and test full-size circuit boards 46, the repeated starting and stopping of the test coupon 12 tests will have minimal impact on the results of any other tests being conducted simultaneously within the test chamber 14.

Thus, although there have been described particular embodiments of the present invention of a new and useful ELECTRONIC CIRCUIT BOARD TESTING SYSTEM, it is not intended that such references be construed as limitations upon the scope of this invention.

What is claimed is:

1. A system for testing an electronic circuit board test coupon comprising:
   a test chamber having one or more side walls defining an interior space, the test chamber operable to maintain the humidity, temperature, and/or pressure of the interior space within desired ranges when the test chamber is substantially closed off to surrounding air;
   at least one port defined in the one or more side walls of the test chamber, the port selectively providing access to the interior space of the test chamber;
   a port extension member removably insertable into the at least one port, the port extension member having a distal end;
   a power source; and
   at least one test coupon connection port located on the distal end of the port extension member and connected to the power source, the at least one test coupon connection port configured to receive and electrically connect to the electronic circuit board test coupon.

2. The system of claim 1, further comprising a main door for selectively providing access to the interior space of the test chamber, wherein each of the at least one ports is smaller than the main door such that each port is capable of selectively providing less access to the test chamber than the main door.

3. The system of claim 1, wherein:
   the at least one port includes an exterior opening and a coupling member positioned adjacent the exterior opening; and
   the port extension member has a proximal end configured to engage the coupling member to secure the port extension member within the at least one port when the distal end of the port extension member is inserted through the at least one port and into the interior space of the test chamber.

4. The system of claim 3, further comprising a flange located on the proximal end of the port extension member 26 and extending radially outward from the at least one port, the flange engageable with the coupling member.

5. The system of claim 4, further comprising a slot within the flange and a protrusion on the coupling member wherein the protrusion is receivable within the slot and the flange can be rotated to achieve a gasketed twist-lock engagement between the flange and the coupling member.

6. The system of claim 2, further comprising a port cap operable to engage the coupling member and cover the at least one port when the port extension member is not positioned within the port.

7. The system of claim 1, further comprising a plurality of ports defined in the one or more side walls of the test chamber, the port extension member removably insertable into at least one of the plurality of ports.

8. The system of claim 7, further comprising a plurality of port caps, each port cap operable to cover at least one corresponding port of the plurality of ports when the port extension member is not positioned within the corresponding port.

9. The system of claim 1, further comprising a full-size electronic circuit board and a fixed electrical connection port mounted within the interior space of the test chamber, the fixed electrical connection port electrically connected to the power source and configured to receive the full-size electronic circuit board, wherein the system can be used to test the test coupons and the full-size electronic circuit board.

10. The system of claim 1, further comprising an electrical meter electrically connected to the power source, the electrical meter operable to measure the electrical current through the test coupon when the test coupon is connected to the test coupon connection port on the port extension member and the port extension member is inserted into the test chamber.

11. The system of claim 1, further comprising an electrical meter electrically connected to the power source, the electrical meter operable to measure the resistance of the test coupon when the test coupon is connected to the test coupon connection port of the port extension member and the port extension member is inserted into the test chamber.

12. The system of claim 1, further comprising an electrical meter electrically connected to the power source, the electrical meter operable to measure the voltage of the test coupon when the test coupon is connected to the test coupon connection port of the port extension member and the port extension member is inserted into the test chamber.

13. The system of claim 1, further comprising an electrical meter electrically connected to the power source, the electrical meter operable to measure the capacitance of the test coupon when the test coupon is connected to the test coupon connection port the port extension member and the port extension member is inserted into the test chamber.

14. The system of claim 1, further comprising:
an electrical meter electrically connected to the power source, the electrical meter operable to measure electrical current; and
a fixed electrical connection port mounted within the interior space of the test chamber, the fixed electrical connection port electrically connected to the power source and configured to receive a full-size electronic circuit board.

15. The system of claim 1, further comprising:
an electrical meter electrically connected to the power source, the electrical meter operable to measure resistance; and
a fixed electrical connection port mounted within the interior space of the test chamber, the fixed electrical connection port electrically connected to the power source and configured to receive a full-size electrical circuit board.

16. The system of claim 1, further comprising:
an electrical meter electrically connected to the power source, the electrical meter operable to measure voltage; and
a fixed electrical connection port mounted within the interior space of the test chamber, the fixed electrical connection port electrically connected to the power source and configured to receive a full-size electronic circuit board.

17. The system of claim 1, further comprising:
an electrical meter electrically connected to the power source, the electrical meter operable to measure capacitance; and
a fixed electrical connection port mounted within the interior space of the test chamber, the fixed electrical connection port electrically connected to the power source and configured to receive a full-size electronic circuit board.

18. The system of claim 1, further comprising a plurality of ports defined in the one or more side walls of the test chamber, the port extension member removably insertable into one or more of the plurality of ports, wherein removing the port extension member from the corresponding port to replace one or more the test coupons and reinserting the port extension member into the corresponding port does not significantly affect the environmental conditions within the test chamber.

19. The system of claim 1, further comprising a plurality of ports defined in the one or more side walls of the test chamber, the port extension member removably insertable into one or more of the plurality of ports, wherein removing the port extension member from the corresponding port to replace one or more the test coupons and reinserting the port extension member into the corresponding port does not invalidate the results of tests that are ongoing during such removal and reinsertion of the port extension member.

20. The system of claim 1, further comprising a full-size electronic circuit board and a plurality of ports defined in the one or more side walls of the test chamber, the port extension member removably insertable into one or more of the plurality of ports, wherein:
the at least one test coupon connection port is configured to receive and electrically connect to the full-size electronic circuit board; and
removing the port extension member from the corresponding port to replace the full-size electronic circuit board and reinserting the port extension member into the corresponding port does not significantly affect the environmental conditions within the test chamber.

* * * * *